(12) United States Patent
Nomura et al.

(10) Patent No.: US 7,907,433 B2
(45) Date of Patent: Mar. 15, 2011

(54) SEMICONDUCTOR MEMORY DEVICE AND METHOD OF PERFORMING DATA REDUCTION TEST

(75) Inventors: Hideo Nomura, Tokyo (JP); Tomonori Hayashi, Tokyo (JP); Yuji Sugiyama, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 141 days.

(21) Appl. No.: 12/385,949

(22) Filed: Apr. 24, 2009

(65) Prior Publication Data
US 2009/0268498 A1 Oct. 29, 2009

(30) Foreign Application Priority Data

Apr. 25, 2008 (JP) .................................. 2008-115828

(51) Int. Cl.
*G11C 5/02* (2006.01)
(52) U.S. Cl. ......................... 365/51; 365/63; 365/189.03
(58) Field of Classification Search .................... 365/51, 365/63, 189.03, 230.06, 201, 226, 225.7, 365/185.27, 230.03, 230.05
See application file for complete search history.

(56) References Cited

U.S. PATENT DOCUMENTS

| 5,511,029 | A | 4/1996 | Sawada et al. |
| 6,529,438 | B1 * | 3/2003 | Suzuki et al. ............ 365/230.06 |
| 2003/0099143 | A1 | 5/2003 | Fujioka et al. |
| 2006/0262587 | A1 * | 11/2006 | Matsui et al. ................... 365/63 |

FOREIGN PATENT DOCUMENTS

| JP | 6-333400 | 12/1994 |
| JP | 2000-040397 | 2/2000 |
| JP | 2003-168299 A | 6/2003 |

* cited by examiner

*Primary Examiner* — Dang T Nguyen
(74) *Attorney, Agent, or Firm* — Foley & Lardner LLP

(57) ABSTRACT

A semiconductor device includes a plurality of package terminals included in a package, a plurality of chips provided on the package, each of the chips including a memory cell array and a plurality of data input/output terminals, and a plurality of data line control switch disposed between the plurality of package terminals and the plurality of data input/output terminals. The plurality of data line control switches of each of the chips connects the data input/output terminals of each of the chips to corresponding ones of the plurality of package terminals in a normal mode. The plurality of data line control switches connects different groups of the data input/output terminals in different ones of the chips to respective groups of the package terminals in a test mode. The respective groups of the data input/output terminals belong to the plurality of data input/output terminals. The respective groups of the package terminals are different between different ones of the chips.

17 Claims, 6 Drawing Sheets

FIG. 3

| CS SIGNAL | | DATA INPUT/ OUTPUT PINS | | SWITCH | | | | | CHIP |
|---|---|---|---|---|---|---|---|---|---|
| CS1 | CS2 | CHIP1 | CHIP2 | SW3 | SW4 | SW6 | SW7 | | |
| Lo | Hi | DQ0,4,8,12 | - | ON | OFF | OFF | OFF | | CHIP1 |
| Lo | Hi | DQ1,5,9,13 | - | OFF | OFF | ON | OFF | | CHIP1 |
| Hi | Lo | - | DQ0,4,8,12 | OFF | ON | OFF | OFF | | CHIP2 |
| Hi | Lo | - | DQ1,5,9,13 | OFF | OFF | OFF | ON | | CHIP2 |
| Lo | Lo | DQ0,4,8,12 | DQ1,5,9,13 | ON | OFF | OFF | ON | | CHIP1,2 |
| Lo | Lo | DQ1,5,9,13 | DQ0,4,8,12 | OFF | ON | ON | OFF | | CHIP1,2 |
| Hi | Hi | - | - | OFF | OFF | OFF | OFF | | - |

FIG. 6

| CS SIGNAL | | DATA INPUT/ OUTPUT PINS | | SWITCH | | CHIP |
|---|---|---|---|---|---|---|
| CS1 | CS2 | CHIP1 | CHIP2 | SW3 | SW4 | |
| Lo | Hi | DQ0,4,8,12 | – | ON | OFF | CHIP1 |
| Hi | Lo | – | DQ0,4,8,12 | OFF | ON | CHIP2 |
| Hi | Hi | – | | OFF | OFF | – |

SEMICONDUCTOR MEMORY DEVICE AND METHOD OF PERFORMING DATA REDUCTION TEST

BACKGROUND OF THE INVENTION

1. Field of the Invention

The present invention generally relates to a semiconductor memory device and a method of performing a data reduction test. More specifically, the present invention relates to a semiconductor memory device of a multi-chip package type that is designed to allow shortening the time for data reduction test or IO reduction test. The present invention further relates to a method of performing a data reduction text in a shortened time period.

Priority is claimed on Japanese Patent Application No. 2008-115828, filed Apr. 25, 2008, the content of which is incorporated herein by reference.

2. Description of the Related Art

In recent years, there has been progressed shrinkage of semiconductor package. For example, the thickness of the package has been on the reduction. The density of integration of the package has been on the increase. The demand for the multi-chip package has been on the increase. The multi-chip package is suitable for realizing the high density integration of the semiconductor memory device, wherein multiple chips are stacked.

The test for the multi-chip package is carried out by testing each chip separately. Increase the number of stacked chips in the multi-chip package will increase the time for the data reduction test. For the production cost to be reduced, there can be need to shorten the time for the data reduction test. A development for the method of shortening the test time is needed, while the number of stacked chips in the multi-chip package is increased in order to increase memory capacity.

Japanese Unexamined Patent Application, First Publication, No. 6-333400 discloses a synchronous semiconductor memory device that is designed to shorten test time for SDRAM. The synchronous semiconductor memory device is adapted to perform data reduction into one-bit data from the data stored in plural memory cells which are simultaneously selected. The synchronous semiconductor memory device is designed to perform test efficiently in a shorten time. However, the synchronous semiconductor memory device is not designed to shorten time for the data reduction test, and not to perform the data reduction test for plural stacked chips simultaneously. The synchronous semiconductor memory device is not designed to shorten the time for the data reduction test and to reduce the production cost.

Japanese Unexamined Patent Application, First Publication, No. 2000-40397 discloses a semiconductor memory device that is designed to perform a kind of IO reduction tests. The semiconductor memory device allows acquisition of redundancy relief address. The semiconductor memory device also allows interfering test between memory cells adjacent to each other. The semiconductor memory device is designed to reduce the chip size and shorten the test time. For performing IO test of the semiconductor memory device, plural bits being different in relief unit are reduced in the same reduction process to store the reduced data, and these plural bits in those relief units are also read out in the same IO reduction process, thereby shortening the test time. However, the semiconductor memory device is not designed to shorten time for the data reduction test, and not to perform the data reduction test for plural stacked chips simultaneously. The semiconductor memory device is not designed to shorten the time for the data reduction test and to reduce the production cost.

Japanese Unexamined Patent Application, First Publication, No. 2003-168299 discloses a memory circuit having data compression function. In the test, the memory circuit reduces the compression rate, while increasing the relief probability by relief cells. Further, the memory circuit allows a tester to perform simultaneous measurements for shortening the test time. However, the memory circuit is not designed to shorten time for the data reduction test, and not to perform the data reduction test for plural stacked chips simultaneously. The s memory circuit is not designed to shorten the time for the data reduction test and to reduce the production cost.

SUMMARY

In one embodiment, a semiconductor device may include, but is not limited to, a plurality of package terminals included in a package, a plurality of chips, and a plurality of data line control switches. The plurality of chips is provided on the package. Each of the chips includes a memory cell array and a plurality of data input/output terminals. The plurality of data line control switches is disposed between the plurality of package terminals and the plurality of data input/output terminals. The plurality of data line control switches of each of the chips connecting the data input/output terminals of each of the chips to corresponding ones of the plurality of package terminals in a normal mode. The plurality of data line control switches connects different groups of the data input/output terminals in different ones of the chips to respective groups of the package terminals in a test mode. The respective groups of the data input/output terminals belong to the plurality of data input/output terminals. The respective groups of the package terminals are different between different ones of the chips.

In another embodiment, a semiconductor device may include, but is not limited to, a first chip included in a package, a second chip included in the package, a plurality of package terminals provided on the package, and a first group of data line control switches. The first chip is included in a package. The first chip has a first memory cell array and a first set of data input/output terminals. The second chip is included in the package. The second chip has a second memory cell array and a second set of data input/output terminals. The plurality of package terminals is provided on the package. The plurality of package pi terminals ns is common to the first and second chips. The first group of data line control switches is provided on the first chip. The first group of data line control switches is disposed between the plurality of package terminals and the first set of data input/output terminals. The first group of data line control switches connects the data input/output terminals to corresponding ones of the plurality of package terminals in a normal mode. The second group of data line control switches connects the data input/output terminals commonly to first respective ones of the package terminals in a test mode. The respective ones of the data input/output terminals belong to the first set of data input/output terminals. The second group of data line control switches is provided on the second chip. The second group of data line control switches is disposed between the plurality of package terminals and the second set of data input/output terminals. The second group of data line control switches connects the data input/output terminals to corresponding ones of the plurality of package terminals in the normal mode. The second group of data line control switches connects the data input/output terminals commonly to second respective ones of the package terminals in the test mode. The second respective ones of the data input/output terminals belong to the second set of data input/output terminals. The first respective ones of the package terminals are different from the second respective ones of the package terminals.

In still another embodiment, a semiconductor device may include, but is not limited to, a package substrate, first and second package terminals arranged on the package substrate, first and second chips, a first switch, a second switch, and a control circuit. The first and second chips are mounted on the package substrate. Each of the first and second chips includes a first terminal connected to the first package terminal and a second terminal connected to the second package terminal. The first switch is arranged between the first and second package terminals and the first and second terminals of the first chip. The first switch disconnects the second terminal of the first chip from the second package terminal and connects the second terminal of the first chip to the first package terminal when a first signal is activated. The second switch is arranged between the first and second package terminals and the first and second terminals of the second chip. The second switch disconnects the first terminal of the second chip from the first package terminal and connects the first terminal of the second chip to the second package terminal when a second signal is activated. The control circuit controls the first and second signals.

BRIEF DESCRIPTION OF THE DRAWINGS

The above features and advantages of the present invention will be more apparent from the following description of certain preferred embodiments taken in conjunction with the accompanying drawings, in which:

FIG. 3 is a table explaining an aspect of the data reduction test in view of the relationships among the CS signal, the selected data terminals, the ON-OFF state of the switches SW3, SW4, SW6 and SW7, and chips CHIP1 and CHIP2 that are to be the subject of the data reduction test;

FIG. 6 is a table that illustrates operations of the data reduction test for the multi-chip package as shown in FIG. 5.

DETAILED DESCRIPTION OF THE PREFERRED EMBODIMENTS

Before describing the present invention, the related art will be explained in detail with reference to FIGS. 4 and 6, in order to facilitate the understanding of the present invention. When data is reduced, a semiconductor memory device in accordance with the related art inhibits data terminals for data reductions from being selected. Rather, the semiconductor memory device selects a fixed set of data terminals for data input and output when data is reduced. When data is reduced, the semiconductor memory device does not use reduced terminals for the test process. The reduced terminals are terminals other than the fixed set of data terminals that are used for the test process.

Figure 4:
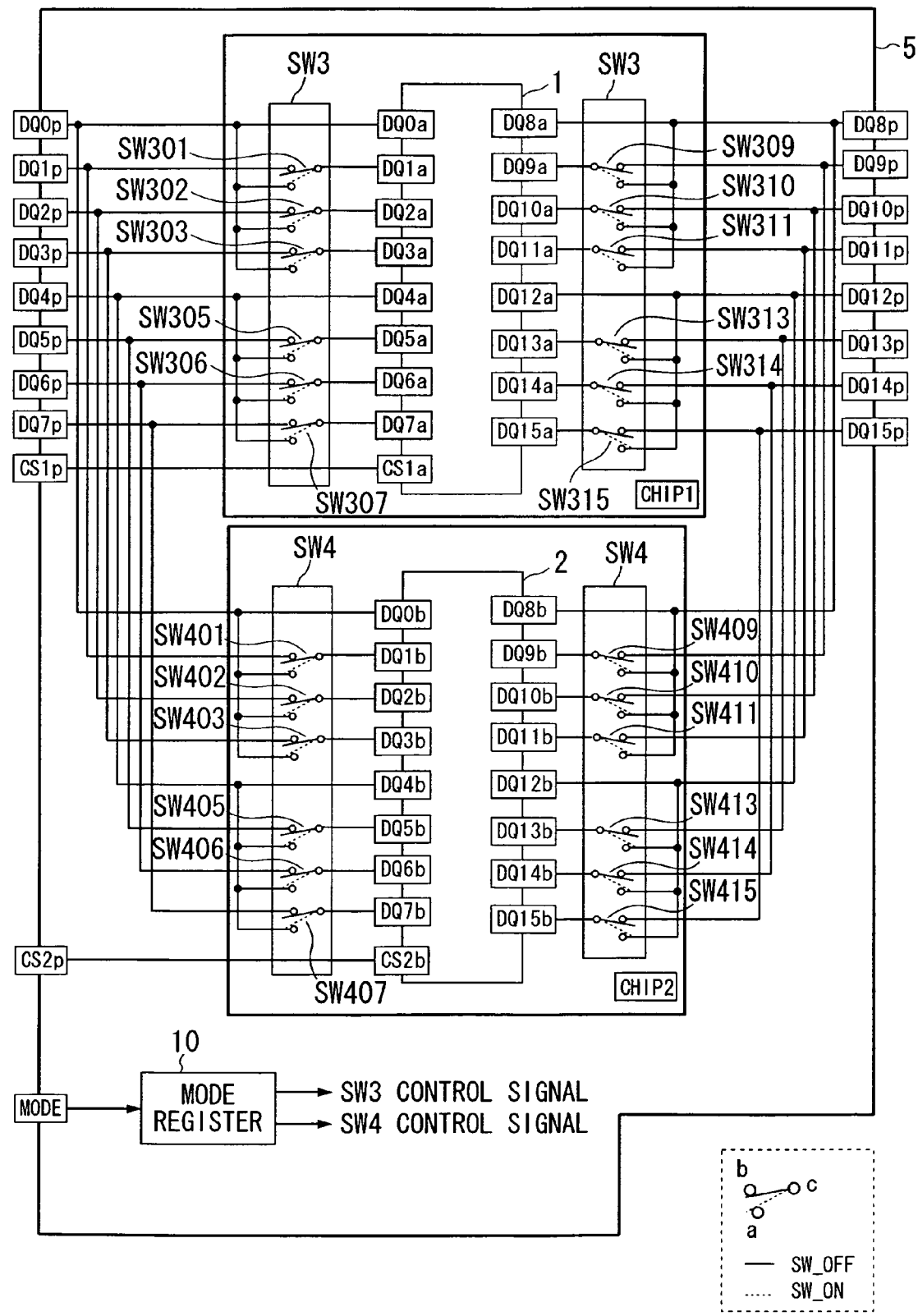
FIG. 4 is a diagram illustrating the configuration of a multi-chip package in accordance with the related art.

FIG. 4 is a diagram illustrating the configuration of a multi-chip package in accordance with the related art. A method of reduction test for the multi-chip package in accordance with the related art will be described with reference to FIG. 4. FIG. 4 illustrates an example of the multi-chip package, wherein first and second chips CHIP1 and CHIP2 are stacked. Each of the first and second chips CHIP1 and CHIP2 includes a memory cell array.

A first set of data terminals 1 include data input/output terminals DQ0a, DQ01a, DQ02a, DQ03a, DQ04a, DQ05a, DQ06a, DQ07a, DQ08a, DQ09a, DQO10a, DQ011a, DQ012a, DQ013a, DQ014a and DQ015a. The data input/output terminals DQ0a-DQ015a are arranged to configure a first data input/output circuit for the first chip CHIP1.

A second set of data terminals 2 include data input/output terminals DQ0b, DQ01b, DQ02b, DQ03b, DQ04b, DQ05b, DQ06b, DQ07b, DQ08b, DQ09b, DQ010b, DQ011b, DQ012b, DQ013b, DQ014b and DQ015b. The data input/output terminals DQ0b-DQ015b are arranged to configure a second data input/output circuit for the second chip CHIP2.

A terminal SC1 performs as a terminal for chip select signal that selects the first chip CHIP1 to be subject to the test. A terminal SC2 performs as a terminal for chip select signal that selects the second chip CHIP2 to be subject to the test.

A first set of data line control switches SW3 is provided for the first chip CHIP1. The first set of data line control switches SW3 perform as control switches for a test circuit to be used to carry out data reduction.

A second set of data line control switches SW4 is provided for the second chip CHIP2. The second set of data line control switches SW4 perform as control switches for a test circuit to be used to carry out data reduction.

A first set of package terminals 5 include data input/output package terminals DQ0p, DQ1p, DQ2p, DQ3p, DQ4p, DQ5p, DQ6p, DQ7p, DQ8p, DQ9p, DQ10p, DQ11p, DQ12p, DQ13p, DQ14p and DQ15p. The data input/output package terminals DQ0p-DQ15p are arranged to configure the first set of package terminals 5 to be used for data input/output to the package.

As shown in FIG. 4, the first chip CHIP1 has the first set of data line control switches SW3 that includes a group of selecting switches. The second chip CHIP2 has the second set of data line control switches SW4 that includes a group of selecting switches. Each selecting switch has a single common and two contacts. The two contacts perform as a make contact and a break contact. The contacts may be realized by, but not limited to, semiconductor switches rather than mechanical switches. FIG. 4 illustrates switching of the first and second sets of data line control switches SW3 and SW4. Each of the first and second sets of data line control switches SW3 and SW4 has a common "c", a make contact "a", and a break contact "b". Each of the first and second sets of data line control switches SW3 and SW4 is so operated as follows. The common "c" is connected to the make contact "a" as represented by the dotted line shown in FIG. 4, so as to place each of the first and second sets of data line control switches SW3 and SW4 in the ON state. The common "c" is connected to the break contact "b" as represented by the real line, so as to place each of the first and second sets of data line control switches SW3 and SW4 in the OFF state shown in FIG. 4. Namely, when each of the first and second sets of data line control switches SW3 and SW4 in the ON state, then the common "c" is connected to the make contact "a" as represented by the dotted line shown in FIG. 4. When each of the first and second sets of data line control switches SW3 and SW4 in the OFF state, then the common "c" is connected to the real contact "b" as represented by the broken line shown in FIG. 4. As described above, the contacts may be realized by, but not limited to, semiconductor switches rather than mechanical switches.

The first set of data line control switch SW3 includes a first group of data line control switches SW301, SW302 and SW303, and a second group of data line control switches SW305, SW306 and SW307. The data line control switches SW301, SW302 and SW303 each have the make contact and the break contact, one contact of which is commonly connected to the data input/output package terminal DQ0p. For example, as shown in FIG. 4, the data line control switch SW301 has the make contact "a" which is connected to the data input/output package terminal DQ0p. The data line control switch SW301 has the break contact "b" which is connected to the data input/output package terminal DQ1p. The data line control switch SW302 has the make contact "a" which is connected to the data input/output package terminal DQ0p. The data line control switch SW302 has the break contact "b" which is connected to the data input/output package terminal DQ2p. The data line control switch SW303 has the make contact "a" which is connected to the data input/output package terminal DQ0p. The data line control switch SW303 has the break contact "b" which is connected to the data input/output package terminal DQ3p. The data line control switches SW305, SW306 and SW307 each have the make contact and the break contact, one contact of which is commonly connected to the data input/output package terminal DQ4p. For example, as shown in FIG. 4, the data line control switch SW305 has the make contact "a" which is connected to the data input/output package terminal DQ4p. The data line control switch SW305 has the break contact "b" which is connected to the data input/output package terminal DQ5p. The data line control switch SW306 has the make contact "a" which is connected to the data input/output package terminal DQ4p. The data line control switch SW306 has the break contact "b" which is connected to the data input/output package terminal DQ6p. The data line control switch SW307 has the make contact "a" which is connected to the data input/output package terminal DQ4p. The data line control switch SW307 has the break contact "b" which is connected to the data input/output package terminal DQ7p.

The first set of data line control switch SW3 further includes a third group of data line control switches SW309, SW310 and SW311, and a fourth group of data line control switches SW313, SW314 and SW315. The data line control switches SW309, SW310 and SW311 each have the make contact and the break contact, one contact of which is commonly connected to the data input/output package terminal DQ8p. For example, as shown in FIG. 4, the data line control switch SW309 has the make contact "a" which is connected to the data input/output package terminal DQ8p. The data line control switch SW309 has the break contact "b" which is connected to the data input/output package terminal DQ9p. The data line control switch SW310 has the make contact "a" which is connected to the data input/output package terminal DQ8p. The data line control switch SW310 has the break contact "b" which is connected to the data input/output package terminal DQ10p. The data line control switch SW311 has the make contact "a" which is connected to the data input/output package terminal DQ8p. The data line control switch SW311 has the break contact "b" which is connected to the data input/output package terminal DQ11p. The data line control switches SW313, SW314 and SW315 each have the make contact and the break contact, one contact of which is commonly connected to the data input/output package terminal DQ12p. For example, as shown in FIG. 4, the data line control switch SW313 has the make contact "a" which is connected to the data input/output package terminal DQ12p. The data line control switch SW313 has the break contact "b" which is connected to the data input/output package terminal DQ13p. The data line control switch SW314 has the make contact "a" which is connected to the data input/output package terminal DQ12p. The data line control switch SW314 has the break contact "b" which is connected to the data input/output package terminal DQ14p. The data line control switch SW315 has the make contact "a" which is connected to the data input/output package terminal DQ12p. The data line control switch SW315 has the break contact "b" which is connected to the data input/output package terminal DQ15p.

The above-described data line control switches SW301, SW302, SW303, SW305, SW306, SW307, SW309, SW310, SW311, SW313, SW314 and SW315 belong to the first set of data line control switch SW3. Those data line control switches included in the first set of data line control switch SW3 perform ON and OFF switching operations, wherein the switching operations are controlled as a whole based on a SW3 control signal. The SW3 control signal is to control the ON and OFF state of the first set of data line control switch SW3 as a whole. The SW3 control signal is supplied from a mode register 10. The mode register 10 receives a mode selecting signal MODE and generates the SW3 control signal based on the mode selecting signal MODE.

The second set of data line control switch SW4 includes a fifth group of data line control switches SW401, SW402 and SW403, and a sixth group of data line control switches SW405, SW406 and SW407. The data line control switches SW401, SW402 and SW403 each have the make contact and the break contact, one contact of which is commonly connected to the data input/output package terminal DQ0p. For example, as shown in FIG. 4, the data line control switch SW401 has the make contact "a" which is connected to the data input/output package terminal DQ0p. The data line control switch SW401 has the break contact "b" which is connected to the data input/output package terminal DQ1p. The data line control switch SW402 has the make contact "a" which is connected to the data input/output package terminal DQ0p. The data line control switch SW402 has the break contact "b" which is connected to the data input/output package terminal DQ2p. The data line control switch SW403 has the make contact "a" which is connected to the data input/output package terminal DQ0p. The data line control switch SW403 has the break contact "b" which is connected to the data input/output package terminal DQ3p. The data line control switches SW405, SW406 and SW407 each have the make contact and the break contact, one contact of which is commonly connected to the data input/output package terminal DQ4p. For example, as shown in FIG. 4, the data line control switch SW405 has the make contact "a" which is connected to the data input/output package terminal DQ4p. The data line control switch SW405 has the break contact "b" which is connected to the data input/output package terminal DQ5p. The data line control switch SW406 has the make contact "a" which is connected to the data input/output package terminal DQ4p. The data line control switch SW406 has the break contact "b" which is connected to the data input/output package terminal DQ6p. The data line control switch SW407 has the make contact "a" which is connected to the data input/output package terminal DQ4p. The data line control switch SW407 has the break contact "b" which is connected to the data input/output package terminal DQ7p.

The second set of data line control switch SW4 further includes a seventh group of data line control switches SW409, SW410 and SW411, and an eighth group of data line control switches SW413, SW414 and SW415. The data line control switches SW409, SW410 and SW411 each have the make contact and the break contact, one contact of which is commonly connected to the data input/output package terminal DQ8p. For example, as shown in FIG. 4, the data line control switch SW409 has the make contact "a" which is connected to the data input/output package terminal DQ8p. The data line control switch SW409 has the break contact "b" which is connected to the data input/output package terminal DQ9p. The data line control switch SW410 has the make contact "a" which is connected to the data input/output package terminal DQ8p. The data line control switch SW410 has the break contact "b" which is connected to the data input/output package terminal DQ10p. The data line control switch SW411 has the make contact "a" which is connected to the data input/output package terminal DQ8p. The data line control switch SW411 has the break contact "b" which is connected to the data input/output package terminal DQ11p. The data line control switches SW413, SW414 and SW415 each have the make contact and the break contact, one contact of which is commonly connected to the data input/output package terminal DQ12p. For example, as shown in FIG. 4, the data line control switch SW413 has the make contact "a" which is connected to the data input/output package terminal DQ12p. The data line control switch SW413 has the break contact "b" which is connected to the data input/output package terminal DQ13p. The data line control switch SW414 has the make contact "a" which is connected to the data input/output package terminal DQ12p. The data line control switch SW314 has the break contact "b" which is connected to the data input/output package terminal DQ14p. The data line control switch SW415 has the make contact "a" which is connected to the data input/output package terminal DQ12p. The data line control switch SW415 has the break contact "b" which is connected to the data input/output package terminal DQ15p.

The above-described data line control switches SW401, SW402, SW403, SW405, SW406, SW407, SW409, SW410, SW411, SW413, SW414 and SW415 belong to the second set of data line control switch SW4. Those data line control switches included in the second set of data line control switch SW4 perform ON and OFF switching operations, wherein the switching operations are controlled as a whole based on a SW4 control signal. The SW4 control signal is to control the ON and OFF state of the second set of data line control switch SW4 as a whole. The SW4 control signal is supplied from the mode register 10. The mode register 10 receives the mode selecting signal MODE and generates the SW4 control signal based on the mode selecting signal MODE.

FIG. 6 is a table that illustrates operations of the data reduction test for the multi-chip package as shown in FIG. 4. FIG. 6 illustrates inter-relationships among the levels of first and second chip select signals CS1 and CS2, selected data input/output terminals, ON-OFF states of switches SW3 and SW4, and a selected chip CHIP1 or CHIP2 to be subjected to the data reduction test for the multi-chip package as shown in FIG. 4 is carried out.

The process for the data reduction test for the multi-chip package as shown in FIG. 4 will be described as follows.

In the first step, the first chip select signal CS1 is low "Lo" (CS1=Lo), and the second chip select signal CS2 is high "Hi" (CS2=Hi), thereby placing the first chip CHIP1 in a data input/output state where the first chip CHIP1 is subjected to the data reduction test.

In the second step, the first set of the data line control switches SW3 turn ON in the first chip CHIP1, while the second set of the data line control switches SW4 turn OFF in the second chip CHIP2, thereby selecting the first chip CHIP1 as the subject to the data reduction test. Namely, the first chip CHIP1 is placed in the state that allows a set of data to be input into or output from the first chip CHIP1 through the data input/output package terminals DQ0p, DQ4p, DQ8p, and DQ12p.

In the third step, a set of data for the first chip CHIP1 is reduced, so as to carry out the read and write operations of the reduced set of data to the first chip CHIP1 through the data input/output package terminals DQ0p, DQ4p, DQ8p, and DQ12p.

The above-described set of the first to third steps complete the data reduction test to the first chip CHIP1. The other data reduction test for the second chip CHIP2 follows the above-described data reduction test for the first chip CHIP1.

In the fourth step, the first chip select signal CS1 is high "Hi" (CS2=Hi), and the second chip select signal CS2 is low "Lo" (CS1=Lo), thereby placing the second chip CHIP2 in a data input/output state where the second chip CHIP2 is subjected to the data reduction test.

In the fifth step, the first set of the data line control switches SW3 turn OFF in the first chip CHIP1, while the second set of the data line control switches SW4 turn ON in the second chip CHIP2, thereby selecting the second chip CHIP2 as the subject to the data reduction test. Namely, the second chip CHIP2 is placed in the state that allows a set of data to be input into or output from the second chip CHIP2 through the data input/output package terminals DQ0p, DQ4p, DQ8p, and DQ12p.

In the sixth step, a set of data for the second chip CHIP2 is reduced, so as to carry out the read and write operations of the reduced set of data to the second chip CHIP2 through the data input/output package terminals DQ0p, DQ4p, DQ8p, and DQ12p.

The above-described set of the fourth to six steps complete the data reduction test to the second chip CHIP2.

The first and second sets of the data line control switches SW3 and SW4 are placed in OFF-state, whereby the multi-chip package is transitioned from the test mode into the normal mode.

The data reduction test of the related art for the multi-chip package is the sequential test to be carried out one chip by one chip, wherein data is input through a single data terminal. The data reduction test of the related art for the multi-chip package does not examine a plurality of chips included in the multi-chip package simultaneously. It is difficult for the data reduction test of the related art for the multi-chip package to shorten the time for the test, and to reduce the production cost.

The invention will be now described herein with reference to illustrative embodiments. Those skilled in the art will recognize that many alternative embodiments can be accomplished using the teaching of the present invention and that the invention is not limited to the embodiments illustrated for explanatory purpose.

Figure 1A:
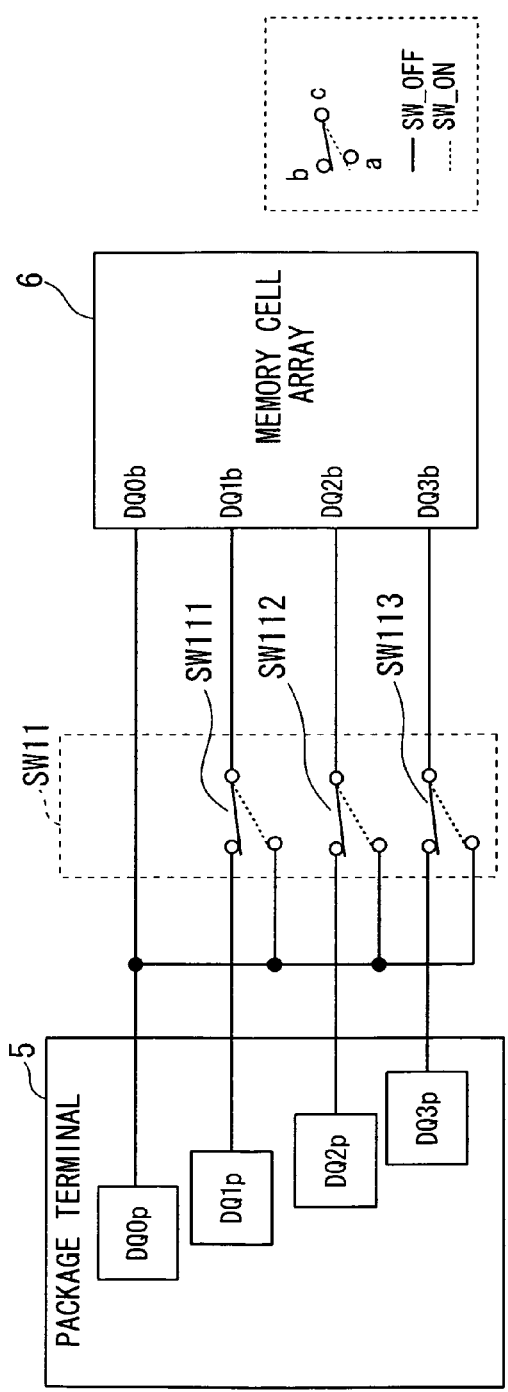
FIG. 1A is a diagram illustrating a data reduction method for a memory cell array of the related art.
Figure 1B:
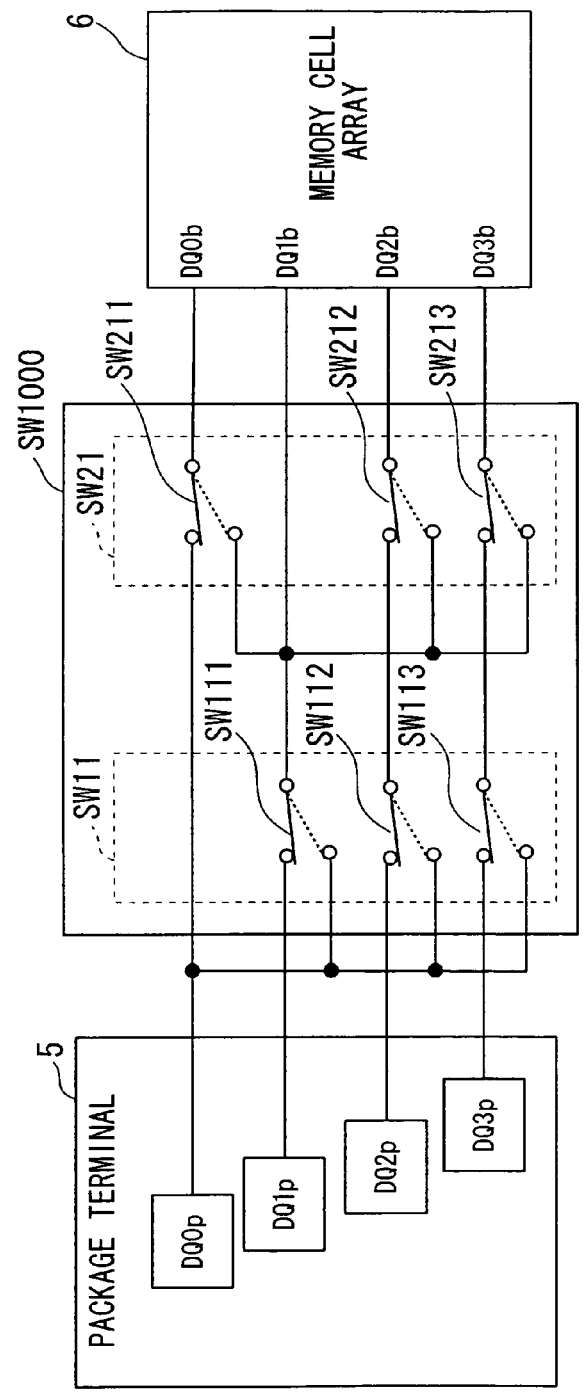
FIG. 1B is a diagram illustrating a data reduction method for a memory cell array in accordance with a first preferred embodiment of the present invention.

FIG. 1A is a diagram illustrating a data reduction method for a memory cell array of the related art. FIG. 1B is a diagram illustrating a data reduction method for a memory cell array in accordance with a first preferred embodiment of the present invention.

In accordance with the related art, a set of data line control switches SW11 is provided in a chip as shown in FIG. 1A. The set of data line control switches SW11 is disposed between a set of package terminals 5 and a memory cell array 6. The set of data line control switches SW11 includes three switches SW11, SW12, and SW13. The memory cell array 6 includes data lines DQ0b, DQ1b, DQ2b, and DQ3b. The set of package terminals 5 includes package terminals DQ0p, DQ1p, DQ2p, and DQ3p.

In the data reduction mode to carry out the data reduction test, the switches SW111, SW112, and SW113 in the set of data line control switches SW11 are turn ON simultaneously, so that all of the data lines DQ0b, DQ1b, DQ2b, and DQ3b of the memory cell array 6 are connected commonly to the package terminal DQ0p, whereby the data reduction is made.

In accordance with the first preferred embodiment, a multi-stage data line control switch SW1000 is provided in a device as shown in FIG 1B. The multi-stage data line control switch SW1000 is disposed between a set of package terminals 5 and a memory cell array 6. The multi-stage data line control switch SW1000 may include, but is not limited to, a series connection of a first set of data line control switches SW11 and a second set of data line control switches SW21 between the set of package terminals 5 and the memory cell array 6. The first set of data line control switches SW11 is disposed between the set of package terminals 5 and the second set of data line control switches SW21. The second set of data line control switches SW21 is disposed between the first set of data line control switches SW11 and the memory cell array 6. The multi-stage data line control switch SW1000 includes a series connection of the first and second sets of data line control switches SW11 and SW21 that are disposed between the set of package terminals 5 and the memory cell array 6.

The first set of data line control switches SW11 and the second set of data line control switches SW21 show separate ON-OFF switching operations. Namely, the ON-OFF switching operations of the first set of data line control switches SW11 is separate from the ON-OFF switching operations of the second set of data line control switches SW21. The first set of data line control switches SW11 includes three switches SW111, SW112, and SW113. The second set of data line control switches SW21 includes three switches SW211, SW212, and SW213.

The memory cell array 6 includes data lines DQ0b, DQ1b, DQ2b, and DQ3b. The set of package terminals 5 includes package terminals DQ0p, DQ1p, DQ2p, and DQ3p. The multi-chip package has four data lines DQ0, DQ1, DQ2 and DQ3.

The first set of data line control switches SW11 can operate to reduce the data lines DQ1, DQ2 and DQ3 to the data line DQ0. The switches SW111, SW112, and SW113 belonging to the first set of data line control switches SW11 can operate to reduce the data lines DQ1, DQ2 and DQ3 to the data line DQ0. The switches SW111, SW112, and SW113 turn ON simultaneously to connect the data lines DQ1, DQ2 and DQ3 to the data line DQ0 commonly. The switches SW111, SW112, and SW113 turn OFF simultaneously to connect the data lines DQ1, DQ2 and DQ3 to the data lines DQ1, DQ2 and DQ3, respectively.

The second set of data line control switches SW21 can operate to reduce the data lines DQ0, DQ2 and DQ3 to the data line DQ1. The switches SW211, SW212, and SW213 belonging to the second set of data line control switches SW21 can operate to reduce the data lines DQ0, DQ2 and DQ3 to the data line DQ1. The switches SW211, SW212, and SW213 turn ON simultaneously to connect the data lines DQ0, DQ2 and DQ3 to the data line DQ1 commonly. The switches SW211, SW212, and SW213 turn OFF simultaneously to connect the data lines DQ0, DQ2 and DQ3 to the data lines DQ0, DQ2 and DQ3, respectively.

The first and second sets of data line control switches SW11 and SW21 are different from each other in a set of data lines that is to be reduced into a data line. A set of data lines that is reduced into a data line by the first set of data line control switches SW11 is different from another set of data lines that is reduced into another data line by the second set of data line control switches SW21. Further, the simultaneous ON-OFF switching operations of the first set of data line control switches SW11 are separate from the simultaneous ON-OFF switching operations of the second set of data line control switches SW21.

The multi-stage data line control switch SW1000 may operate as follows.

The switches SW111, SW112, and SW113 belonging to the first set of data line control switches SW11 turn ON simultaneously, while the switches SW211, SW212, and SW213 belonging to the second set of data line control switches SW21 turn OFF simultaneously. Namely, the first set of data line control switches SW11 turn ON, while the second set of data line control switches SW21 turn OFF, thereby connecting the data lines DQ0b, DQ1b, DQ2b, and DQ3b in the memory cell array 6 commonly to the package terminal DQ0P in the package terminal 5. Namely, the first set of data line control switches SW11 turn ON, while the second set of data line control switches SW21 turn OFF, thereby reducing the data lines DQ0b, DQ1b, DQ2b, and DQ3b in the memory cell array 6 commonly to the package terminal DQ0P in the package terminal 5.

The switches SW111, SW112, and SW113 belonging to the first set of data line control switches SW11 turn OFF simultaneously, while the switches SW211, SW212, and SW213 belonging to the second set of data line control switches SW21 turn ON simultaneously. Namely, the first set of data line control switches SW11 turn OFF, while the second set of data line control switches SW21 turn ON, thereby connecting the data lines DQ0b, DQ1b, DQ2b, and DQ3b in the memory cell array 6 commonly to the package terminal DQ1P in the package terminal 5. Namely, the first set of data line control switches SW11 turn OFF, while the second set of data line control switches SW21 turn ON, thereby reducing the data lines DQ0b, DQ1b, DQ2b, and DQ3b in the memory cell array 6 commonly to the package terminal DQ1P in the package terminal 5.

The first set of data line control switches SW11 turn ON, while the second set of data line control switches SW21 turn OFF, thereby connecting the data lines DQ0b, DQ1b, DQ2b, and DQ3b commonly to the package terminal DQ0P, so as to allow data input/output with the memory cell array 6 through the package terminal DQ0P in the package terminal 5. The first set of data line control switches SW1 turn OFF, while the second set of data line control switches SW21 turn ON, thereby connecting the data lines DQ0b, DQ1b, DQ2b, and DQ3b commonly to the package terminal DQ1P, and thus so as to allow data input/output with the memory cell array 6 through the package terminal DQ1P in the package terminal 5. The multi-stage data line control switch SW1000 can perform data reduction, while allowing data input/output with the memory cell array 6 through two package terminals DQ0p and DQ1p.

Figure 2:
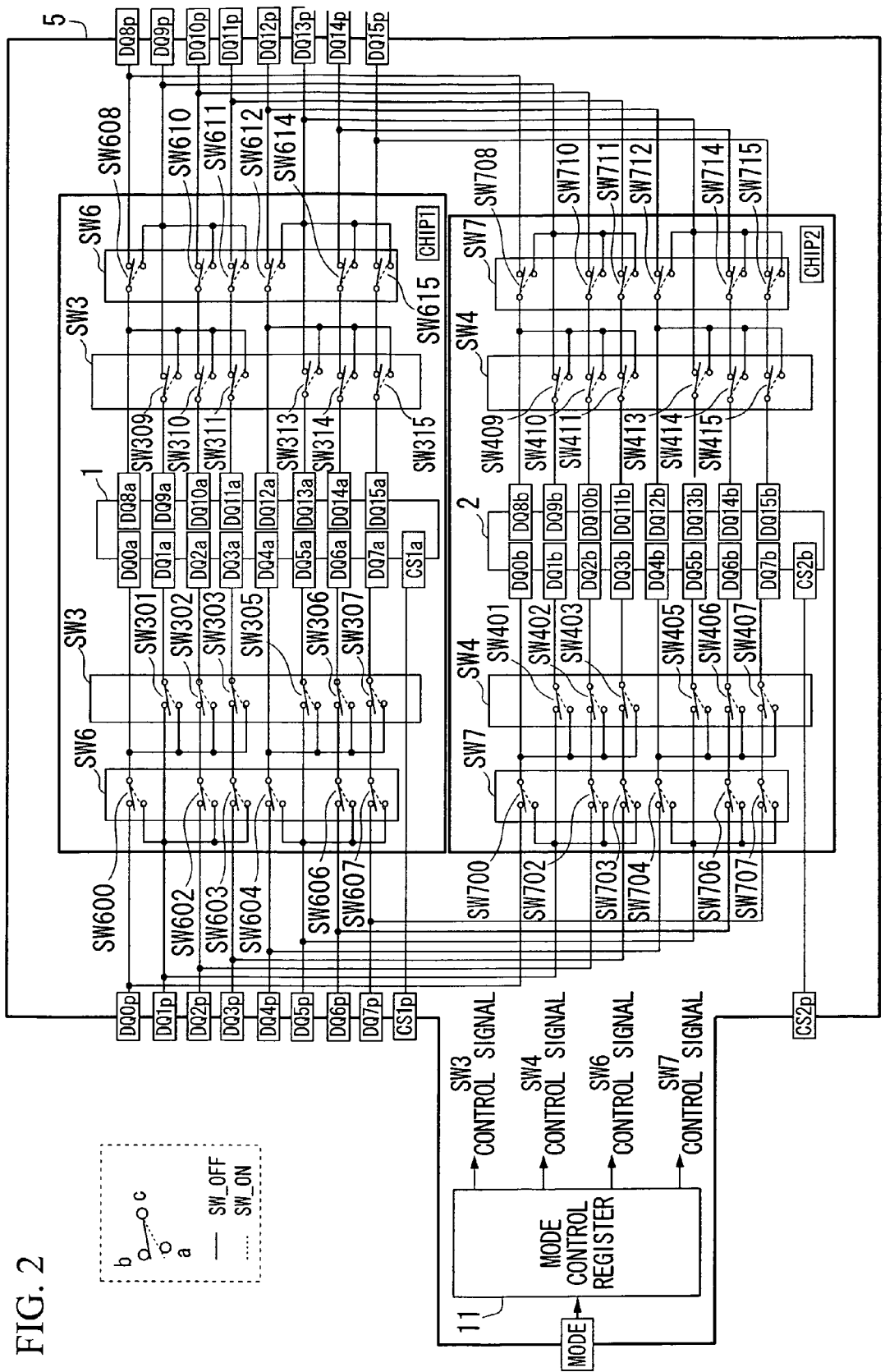
FIG. 2 illustrates the configuration of a multi-chip package in accordance with the first preferred embodiment.

FIG. 2 illustrates the configuration of a multi-chip package in accordance with the first preferred embodiment. The configuration of the multi-chip package as shown in FIG. 2 in accordance with the first preferred embodiment is different from the configuration of the multi-chip package of the related art as shown in FIG. 4. The configuration of the multi-chip package includes a plurality of chips, each of which may include a multi-stage data line control switch, a set of package terminals, and a memory cell array, wherein the multi-stage data line control switch is disposed between the set of package terminals, and the memory cell array.

In some cases, the configuration of the multi-chip package may include, but is not limited to, first and second chips CHIP1 and CHIP2. The first chip CHIP1 may include, but is not limited to, a series connection of plural sets of data line control switches between a set of package terminals 5 and a memory cell array 1. In some cases, first chip CHIP1 may include, but is not limited to, a series connection of a first set of data line control switches SW3 and a second set of data line control switches SW6. The series connation of the first set of data line control switches SW3 and the second set of data line control switches SW6 is disposed between the set of package terminals 5 and the memory cell array 1.

The first set of data line control switches SW3 is disposed between the memory cell array 1 and the second set of data line control switches SW6. The second set of data line control switches SW6 is disposed between the set of package terminals 5 and the first set of data line control switches SW3.

In some cases, the memory cell array 1 may include, but is not limited to, data lines DQ0*a*, DQ1*a*, DQ2*a*, DQ3*a*, DQ4*a*, DQ5*a*, DQ6*a*, DQ7*a*, DQ8*a*, DQ9*a*, DQ10*a*, DQ11*a*, DQ12*a*, DQ13*a*, DQ14*a*, and DQ15*a*, and a chip select signal CS1.

In some cases, the set of package terminals 5 may include, but is not limited to, package terminals DQ0*p*, DQ1*p*, DQ2*p*, DQ3*p*, DQ4*p*, DQ5*p*, DQ6*p*, DQ7*p*, DQ8*p*, DQ9*p*, DQ10*p*, DQ11*p*, DQ12*p*, DQ13*p*, DQ14*p* and DQ15*p*, and first and second chip select signals CS1*p* and CS2*p*.

In some cases, the first set of data line control switches SW3 may include a group of data line control switches SW301, SW302, SW303, SW305, SW306, SW307, SW309, SW310, SW311, SW313, SW314 and SW315, each of which has a make contact "a", a break contact "b" and a common contact "c".

In some cases, the second set of data line control switches SW6 may include a group of data line control switches SW600, SW602, SW603, SW604, SW606, SW607, SW608, SW610, SW611, SW612, SW614 and SW615, each of which has a make contact "a", a break contact "b" and a common contact "c".

The data line control switch SW301 has the make contact "a" that is connected to the common contact "c" of the data line control switch SW600. The data line control switch SW301 has the break contact "b" that is connected to the package terminal DQ1*p* of the set of package terminals 5. The data line control switch SW301 has the common contact "c" that is connected to the data line DQ1*a* of the memory cell array 1.

The data line control switch SW302 has the make contact "a" that is connected to the common contact "c" of the data line control switch SW600. The data line control switch SW302 has the break contact "b" that is connected to the package terminal DQ2*p* of the set of package terminals 5. The data line control switch SW302 has the common contact "c" that is connected to the data line DQ2*a* of the memory cell array 1.

The data line control switch SW303 has the make contact "a" that is connected to the common contact "c" of the data line control switch SW600. The data line control switch SW303 has the break contact "b" that is connected to the package terminal DQ3*p* of the set of package terminals 5. The data line control switch SW303 has the common contact "c" that is connected to the data line DQ3*a* of the memory cell array 1.

The data line control switch SW305 has the make contact "a" that is connected to the common contact "c" of the data line control switch SW604. The data line control switch SW305 has the break contact "b" that is connected to the package terminal DQ5*p* of the set of package terminals 5. The data line control switch SW305 has the common contact "c" that is connected to the data line DQ5*a* of the memory cell array 1.

The data line control switch SW306 has the make contact "a" that is connected to the common contact "c" of the data line control switch SW604. The data line control switch SW306 has the break contact "b" that is connected to the package terminal DQ6*p* of the set of package terminals 5. The data line control switch SW306 has the common contact "c" that is connected to the data line DQ6*a* of the memory cell array 1.

The data line control switch SW307 has the make contact "a" that is connected to the common contact "c" of the data line control switch SW604. The data line control switch SW307 has the break contact "b" that is connected to the package terminal DQ7*p* of the set of package terminals 5. The data line control switch SW307 has the common contact "c" that is connected to the data line DQ7*a* of the memory cell array 1.

The data line control switch SW309 has the make contact "a" that is connected to the common contact "c" of the data line control switch SW608. The data line control switch SW309 has the break contact "b" that is connected to the package terminal DQ9*p* of the set of package terminals 5. The data line control switch SW309 has the common contact "c" that is connected to the data line DQ9*a* of the memory cell array 1.

The data line control switch SW310 has the make contact "a" that is connected to the common contact "c" of the data line control switch SW608. The data line control switch SW310 has the break contact "b" that is connected to the package terminal DQ10*p* of the set of package terminals 5. The data line control switch SW310 has the common contact "c" that is connected to the data line DQ10*a* of the memory cell array 1.

The data line control switch SW311 has the make contact "a" that is connected to the common contact "c" of the data line control switch SW608. The data line control switch SW311 has the break contact "b" that is connected to the package terminal DQ11*p* of the set of package terminals 5. The data line control switch SW311 has the common contact "c" that is connected to the data line DQ11*a* of the memory cell array 1.

The data line control switch SW313 has the make contact "a" that is connected to the common contact "c" of the data line control switch SW612. The data line control switch SW313 has the break contact "b" that is connected to the package terminal DQ13*p* of the set of package terminals 5. The data line control switch SW313 has the common contact "c" that is connected to the data line DQ13*a* of the memory cell array 1.

The data line control switch SW314 has the make contact "a" that is connected to the common contact "c" of the data line control switch SW612. The data line control switch SW314 has the break contact "b" that is connected to the package terminal DQ14*p* of the set of package terminals 5. The data line control switch SW314 has the common contact "c" that is connected to the data line DQ14*a* of the memory cell array 1.

The data line control switch SW315 has the make contact "a" that is connected to the common contact "c" of the data line control switch SW612. The data line control switch SW315 has the break contact "b" that is connected to the package terminal DQ15*p* of the set of package terminals 5. The data line control switch SW315 has the common contact "c" that is connected to the data line DQ15*a* of the memory cell array 1.

The data line control switch SW600 has the make contact "a" that is connected to the package terminal DQ1*p* of the set of package terminals 5. The data line control switch SW600 has the break contact "b" that is connected to the package terminal DQ0p of the set of package terminals 5. The data line control switch SW600 has the common contact "c" that is connected to the data line DQ0a of the memory cell array 1.

The data line control switch SW602 has the make contact "a" that is connected to the package terminal DQ1p of the set of package terminals 5. The data line control switch SW602 has the break contact "b" that is connected to the package terminal DQ2p of the set of package terminals 5. The data line control switch SW602 has the common contact "c" that is connected to the break contact "b" of the data line control switch SW302.

The data line control switch SW603 has the make contact "a" that is connected to the package terminal DQ1p of the set of package terminals 5. The data line control switch SW603 has the break contact "b" that is connected to the package terminal DQ3p of the set of package terminals 5. The data line control switch SW603 has the common contact "c" that is connected to the break contact "b" of the data line control switch SW303.

The data line control switch SW604 has the make contact "a" that is connected to the package terminal DQ5p of the set of package terminals 5. The data line control switch SW604 has the break contact "b" that is connected to the package terminal DQ4p of the set of package terminals 5. The data line control switch SW604 has the common contact "c" that is connected to the data line DQ4a of the memory cell array 1.

The data line control switch SW606 has the make contact "a" that is connected to the package terminal DQ5p of the set of package terminals 5. The data line control switch SW606 has the break contact "b" that is connected to the package terminal DQ6p of the set of package terminals 5. The data line control switch SW606 has the common contact "c" that is connected to the break contact "b" of the data line control switch SW306.

The data line control switch SW607 has the make contact "a" that is connected to the package terminal DQ5p of the set of package terminals 5. The data line control switch SW607 has the break contact "b" that is connected to the package terminal DQ7p of the set of package terminals 5. The data line control switch SW607 has the common contact "c" that is connected to the break contact "b" of the data line control switch SW307.

The data line control switch SW608 has the make contact "a" that is connected to the package terminal DQ9p of the set of package terminals 5. The data line control switch SW608 has the break contact "b" that is connected to the package terminal DQ8p of the set of package terminals 5. The data line control switch SW608 has the common contact "c" that is connected to the data line DQ8a of the memory cell array 1.

The data line control switch SW610 has the make contact "a" that is connected to the package terminal DQ9p of the set of package terminals 5. The data line control switch SW610 has the break contact "b" that is connected to the package terminal DQ10p of the set of package terminals 5. The data line control switch SW610 has the common contact "c" that is connected to the break contact "b" of the data line control switch SW310.

The data line control switch SW611 has the make contact "a" that is connected to the package terminal DQ9p of the set of package terminals 5. The data line control switch SW611 has the break contact "b" that is connected to the package terminal DQ1p of the set of package terminals 5. The data line control switch SW611 has the common contact "c" that is connected to the break contact "b" of the data line control switch SW311.

The data line control switch SW612 has the make contact "a" that is connected to the package terminal DQ13p of the set of package terminals 5. The data line control switch SW612 has the break contact "b" that is connected to the package terminal DQ12p of the set of package terminals 5. The data line control switch SW612 has the common contact "c" that is connected to the data line DQ12a of the memory cell array 1.

The data line control switch SW614 has the make contact "a" that is connected to the package terminal DQ13p of the set of package terminals 5. The data line control switch SW614 has the break contact "b" that is connected to the package terminal DQ14p of the set of package terminals 5. The data line control switch SW614 has the common contact "c" that is connected to the break contact "b" of the data line control switch SW314.

The data line control switch SW615 has the make contact "a" that is connected to the package terminal DQ13p of the set of package terminals 5. The data line control switch SW615 has the break contact "b" that is connected to the package terminal DQ15p of the set of package terminals 5. The data line control switch SW615 has the common contact "c" that is connected to the break contact "b" of the data line control switch SW315.

The second chip CHIP2 may include, but is not limited to, another series connection of plural sets of data line control switches between the set of package terminals 5 and a memory cell array 2. In some cases, the second chip CHIP2 may include, but is not limited to, a series connection of a third set of data line control switches SW4 and a fourth set of data line control switches SW7. The series connation of the third set of data line control switches SW4 and the fourth set of data line control switches SW7 is disposed between the set of package terminals 5 and the memory cell array 2.

The second chip CHIP2 may include, but is not limited to, another series connection of plural sets of data line control switches between the set of package terminals 5 and a memory cell array 2. In some cases, the second chip CHIP2 may include, but is not limited to, a series connection of a third set of data line control switches SW4 and a fourth set of data line control switches SW7. The series connation of the third set of data line control switches SW4 and the fourth set of data line control switches SW7 is disposed between the set of package terminals 5 and the memory cell array 2.

The third set of data line control switches SW4 is disposed between the memory cell array 2 and the fourth set of data line control switches SW7. The fourth set of data line control switches SW7 is disposed between the set of package terminals 5 and the third set of data line control switches SW4.

In some cases, the memory cell array 2 may include, but is not limited to, data lines DQ0b, DQ1b, DQ2b, DQ3b, DQ4b, DQ5b, DQ6b, DQ7b, DQ8b, DQ9b, DQ10b, DQ11b, DQ12b, DQ13b, DQ14b, and DQ15b, and a chip select signal CS2.

In some cases, the third set of data line control switches SW4 may include a group of data line control switches SW401, SW402, SW403, SW405, SW406, SW407, SW409, SW410, SW411, SW413, SW414 and SW415, each of which has a make contact "a", a break contact "b" and a common contact "c".

In some cases, the fourth set of data line control switches SW7 may include a group of data line control switches SW700, SW702, SW703, SW704, SW706, SW707, SW708, SW710, SW711, SW712, SW714 and SW715, each of which has a make contact "a", a break contact "b" and a common contact "c".

The third set of data line control switches SW4 have the same configuration as the first set of data line control switches SW3. The fourth set of data line control switches SW7 have the same configuration as the second set of data line control switches SW6. Namely, each chip has the same configuration of the data line control switches.

As shown in FIG. 2, the first chip CHIP1 includes the first set of data line control switches SW3, and the second set of data line control switches SW6. The second chip CHIP2 includes the third set of data line control switches SW4, and the fourth set of data line control switches SW7.

In the first chip CHIP1, the first set of data line control switches SW3 includes first to fourth groups of data line control switches. The first group of data line control switches includes data line control switches SW301, SW302 and SW303 each having a contact being connected commonly to the data line DQ0 and the data input/output terminal DQ0a. The second group of data line control switches includes data line control switches SW305, SW306 and SW307 each having a contact being connected commonly to the data line DQ4 and the data input/output terminal DQ4a. The third group of data line control switches includes data line control switches SW309, SW310 and SW311 each having a contact being connected commonly to the data line DQ8 and the data input/output terminal DQ8a. The fourth group of data line control switches includes data line control switches SW313, SW314 and SW315 each having a contact being connected commonly to the data line DQ12 and the data input/output terminal DQ12a. The data line control switches SW301, SW302, SW303, SW305, SW306, SW307, SW309, SW310, SW311, SW313, SW314 and SW315 belonging to the first set of data line control switches SW3 all simultaneously turn ON, or all simultaneously turn OFF, based on an SW3 control signal that is supplied from a mode register 11.

In the first chip CHIP1, the second set of data line control switches SW6 includes fifth to eighth groups of data line control switches. The fifth group of data line control switches includes data line control switches SW600, SW602 and SW603 each having a contact being connected commonly to the package terminal DQ1p. The sixth group of data line control switches includes data line control switches SW604, SW606 and SW607 each having a contact being connected commonly to the package terminal DQ5p. The seventh group of data line control switches includes data line control switches SW608, SW610 and SW611 each having a contact being connected commonly to the package terminal DQ9p. The eighth group of data line control switches includes data line control switches SW612, SW614 and SW615 each having a contact being connected commonly to the package terminal DQ13p. The data line control switches SW600, SW602, SW603, SW604, SW606, SW607, SW608, SW610, SW611, SW612, SW614 and SW615 belonging to the second set of data line control switches SW6 all simultaneously turn ON, or all simultaneously turn OFF, based on an SW6 control signal that is supplied from the mode register 11.

In the first chip CHIP1, the multi-stage data line control switch that includes the first and second sets of data line control switches SW3 and SW6 allows selecting the data line that is to be reduced, wherein the selection of the data line is made from the data lines DQ0 and DQ1.

In the second chip CHIP2, the third set of data line control switches SW4 includes first to fourth groups of data line control switches. The first group of data line control switches includes data line control switches SW401, SW402 and SW403 each having a contact being connected commonly to the data line DQ0 and the data input/output terminal DQ0b. The second group of data line control switches includes data line control switches SW405, SW406 and SW407 each having a contact being connected commonly to the data line DQ4 and the data input/output terminal DQ4b. The third group of data line control switches includes data line control switches SW409, SW410 and SW411 each having a contact being connected commonly to the data line DQ8 and the data input/output terminal DQ8b. The fourth group of data line control switches includes data line control switches SW413, SW414 and SW415 each having a contact being connected commonly to the data line DQ12 and the data input/output p terminal in DQ12b. The data line control switches SW401, SW402, SW403, SW405, SW406, SW407, SW409, SW410, SW411, SW413, SW414 and SW415 belonging to the third set of data line control switches SW4 all simultaneously turn ON, or all simultaneously turn OFF, based on an SW4 control signal that is supplied from the mode register 11.

In the second chip CHIP2, the fourth set of data line control switches SW7 includes fifth to eighth groups of data line control switches. The fifth group of data line control switches includes data line control switches SW700, SW702 and SW703 each having a contact being connected commonly to the package terminal DQ1p. The sixth group of data line control switches includes data line control switches SW704, SW706 and SW707 each having a contact being connected commonly to the package terminal DQ5p. The seventh group of data line control switches includes data line control switches SW708, SW710 and SW711 each having a contact being connected commonly to the package terminal DQ9p. The eighth group of data line control switches includes data line control switches SW712, SW714 and SW715 each having a contact being connected commonly to the package terminal DQ13p. The data line control switches SW700, SW702, SW703, SW704, SW706, SW707, SW708, SW710, SW711, SW712, SW714 and SW715 belonging to the fourth set of data line control switches SW7 all simultaneously turn ON, or all simultaneously turn OFF, based on an SW7 control signal that is supplied from the mode register 11.

In the second chip CHIP2, the multi-stage data line control switch that includes the first and second sets of data line control switches SW4 and SW7 allows selecting the data line that is to be reduced, wherein the selection of the data line is made from the data lines DQ0 and DQ1.

FIG. 3 is a table explaining an aspect of the data reduction test in view of the relationships among the CS signal, the selected data terminals, the ON-OFF state of the switches SW3, SW4, SW6 and SW7, and chips CHIP1 and CHIP2 that are to be the subject of the data reduction test.

When the chip CHIP1 is selected to be the subject of the data reduction test, the first chip select signal CS1 is low, and the second chip select signal CS2 is high, so that the chip CHIP1 is placed in a data input/output enable state that enables data input/output to the chip CHIP1.

The following switching operations are made in order to enable data input/output to the chip CHIP1 through the package terminals DQ0p, DQ4p, DQ8p, and DQ12p. Each of the data line control switches SW301, SW302, SW303, SW305, SW306, SW307, SW309, SW310, SW311, SW313, SW314 and SW315 belonging to the first set of data line control switches SW3 turn ON. Each of the data line control switches SW600, SW602, SW603, SW604, SW606, SW607, SW608, SW610, SW611, SW612, SW614 and SW615 belonging to the second set of data line control switches SW6 turn OFF. Each of the data line control switches SW401, SW402, SW403, SW405, SW406, SW407, SW409, SW410, SW411, SW413, SW414 and SW415 belonging to the third set of data line control switches SW4 turn OFF. Each of the data line control switches SW700, SW702, SW703, SW704, SW706, SW707, SW708, SW710, SW711, SW712, SW714 and SW715 belonging to the fourth set of data line control switches SW7 turn OFF. These switching operations enables data input/output to the chip CHIP1 through the package terminals DQ0p, DQ4p, DQ8p, and DQ12p.

The following switching operations are made in order to enable data input/output to the chip CHIP1 through the package terminals DQ1p, DQ5p, DQ9p, and DQ13p. Each of the data line control switches SW600, SW602, SW603, SW604, SW606, SW607, SW608, SW610, SW611, SW612, SW614 and SW615 belonging to the second set of data line control switches SW6 turn ON. Each of the data line control switches SW301, SW302, SW303, SW305, SW306, SW307, SW309, SW310, SW311, SW313, SW314 and SW315 belonging to the first set of data line control switches SW3 turn OFF. Each of the data line control switches SW401, SW402, SW403, SW405, SW406, SW407, SW409, SW410, SW411, SW413, SW414 and SW415 belonging to the third set of data line control switches SW4 turn OFF. Each of the data line control switches SW700, SW702, SW703, SW704, SW706, SW707, SW708, SW710, SW711, SW712, SW714 and SW715 belonging to the fourth set of data line control switches SW7 turn OFF. These switching operations enables data input/output to the chip CHIP1 through the package terminals DQ1p, DQ5p, DQ9p, and DQ13p.

When the chip CHIP2 is selected to be the subject of the data reduction test, the first chip select signal CS1 is high, and the second chip select signal CS2 is low, so that the chip CHIP2 is placed in a data input/output enable state that enables data input/output to the chip CHIP2.

The following switching operations are made in order to enable data input/output to the chip CHIP2 through the package terminals DQ0p, DQ4p, DQ8p, and DQ12p. Each of the data line control switches SW401, SW402, SW403, SW405, SW406, SW407, SW409, SW410, SW411, SW413, SW414 and SW415 belonging to the third set of data line control switches SW4 turn ON. Each of the data line control switches SW301, SW302, SW303, SW305, SW306, SW307, SW309, SW310, SW311, SW313, SW314 and SW315 belonging to the first set of data line control switches SW3 turn OFF. Each of the data line control switches SW600, SW602, SW603, SW604, SW606, SW607, SW608, SW610, SW611, SW612, SW614 and SW615 belonging to the second set of data line control switches SW6 turn OFF. Each of the data line control switches SW700, SW702, SW703, SW704, SW706, SW707, SW708, SW710, SW711, SW712, SW714 and SW715 belonging to the fourth set of data line control switches SW7 turn OFF. These switching operations enables data input/output to the chip CHIP2 through the package terminals DQ0p, DQ4p, DQ8p, and DQ12p.

The following switching operations are made in order to enable data input/output to the chip CHIP2 through the package terminals DQ1p, DQ5p, DQ9p, and DQ13p. Each of the data line control switches SW700, SW702, SW703, SW704, SW706, SW707, SW708, SW710, SW711, SW712, SW714 and SW715 belonging to the fourth set of data line control switches SW7 turn ON. Each of the data line control switches SW301, SW302, SW303, SW305, SW306, SW307, SW309, SW310, SW311, SW313, SW314 and SW315 belonging to the first set of data line control switches SW3 turn OFF. Each of the data line control switches SW600, SW602, SW603, SW604, SW606, SW607, SW608, SW610, SW611, SW612, SW614 and SW615 belonging to the second set of data line control switches SW6 turn OFF. Each of the data line control switches SW401, SW402, SW403, SW405, SW406, SW407, SW409, SW410, SW411, SW413, SW414 and SW415 belonging to the third set of data line control switches SW4 turn OFF. These switching operations enables data input/output to the chip CHIP2 through the package terminals DQ1p, DQ5p, DQ9p, and DQ13p.

When both the chips CHIP1 and CHIP2 are selected to be the subject of the data reduction test, the first chip select signal CS1 is low, and the second chip select signal CS2 is low, so that both the chips CHIP1 and CHIP2 are placed in data input/output enable states that enable data input/output to the chips CHIP1 and CHIP2.

The following switching operations are made in order to enable data input/output to the chip CHIP1 through the package terminals DQ0p, DQ4p, DQ8p, and DQ12p and also to enable data input/output to the chip CHIP2 through the package terminals DQ1p, DQ5p, DQ9p, and DQ13p. Each of the data line control switches SW301, SW302, SW303, SW305, SW306, SW307, SW309, SW310, SW311, SW313, SW314 and SW315 belonging to the first set of data line control switches SW3 turn ON. Each of the data line control switches SW700, SW702, SW703, SW704, SW706, SW707, SW708, SW710, SW711, SW712, SW714 and SW715 belonging to the fourth set of data line control switches SW7 turn ON. Each of the data line control switches SW600, SW602, SW603, SW604, SW606, SW607, SW608, SW610, SW611, SW612, SW614 and SW615 belonging to the second set of data line control switches SW6 turn OFF. Each of the data line control switches SW401, SW402, SW403, SW405, SW406, SW407, SW409, SW410, SW411, SW413, SW414 and SW415 belonging to the third set of data line control switches SW4 turn OFF. These switching operations enable data input/output to the chip CHIP1 through the package terminals DQ0p, DQ4p, DQ8p, and DQ12p and also enable data input/output to the chip CHIP2 through the package terminals DQ1p, DQ5p, DQ9p, and DQ13p.

The following switching operations are made in order to enable data input/output to the chip CHIP1 through the package terminals DQ1p, DQ5p, DQ9p, and DQ13p and also to enable data input/output to the chip CHIP2 through the package terminals DQ0p, DQ4p, DQ8p, and DQ12p. Each of the data line control switches SW401, SW402, SW403, SW405, SW406, SW407, SW409, SW410, SW411, SW413, SW414 and SW415 belonging to the third set of data line control switches SW4 turn ON. Each of the data line control switches SW600, SW602, SW603, SW604, SW606, SW607, SW608, SW610, SW611, SW612, SW614 and SW615 belonging to the second set of data line control switches SW6 turn ON. Each of the data line control switches SW301, SW302, SW303, SW305, SW306, SW307, SW309, SW310, SW311, SW313, SW314 and SW315 belonging to the first set of data line control switches SW3 turn OFF. Each of the data line control switches SW700, SW702, SW703, SW704, SW706, SW707, SW708, SW710, SW711, SW712, SW714 and SW715 belonging to the fourth set of data line control switches SW7 turn OFF. These switching operations enable data input/output to the chip CHIP1 through the package terminals DQ1p, DQ5p, DQ9p, and DQ13p and also enable data input/output to the chip CHIP2 through the package terminals DQ0p, DQ4p, DQ8p, and DQ12p.

FIG. 3 is a table showing the SC signals, the data input/output terminals, the ON/OFF states of the switches, and selection of the chips for carrying out the data reduction test for both the chips CHIP1 and CHIP2 simultaneously. Both the chips CHIP1 and CHIP2 are placed to be the subject of the data reduction test simultaneously.

In the first step, the first chip select signal CS1 is low, and the second chip select signal CS2 is low, so that both the chips CHIP1 and CHIP2 are placed in data input/output enable states that enable data input/output to the chips CHIP1 and CHIP2.

In the second step, the mode register 11 is set so as follows. Each data line control switch belonging to the first set of data line control switches SW3 turn ON. Each data line control switch belonging to the second set of data line control switches SW6 turn OFF. Each data line control switch belonging to the third set of data line control switches SW4 turn OFF. Each data line control switch belonging to the fourth set of data line control switches SW7 turn ON.

As a result of taking place the first and second steps, the chip CHIP1 is placed into the enable state that enables reducing and reading/writing input data into the chip CHIP1 through selected one or ones of the package terminals DQ0p, DQ4p, DQ8p, and DQ12p. At the same time, the chip CHIP2 is placed into the enable state that enables reducing and reading/writing input data into the chip CHIP2 through selected one or ones of the package terminals DQ1p, DQ5p, DQ9p, and DQ13p. Namely, both the chips CHIP1 and CHIP2 are simultaneously placed to enable reducing and reading/writing input data through selected one or ones of a respective set of four package terminals. Taking place the first and second steps will select data terminals that are to be used for data input/output with reducing the data in order to accomplish the data reduction test to all of the chips simultaneously, for example, the chips CHIP1 and CHIP2, which are included in the multi-chip package. Namely, the chips CHIP1 and CHIP2 included in the multi-chip package are enabled to be subject to the data reduction tests simultaneously. Taking place the first and second steps will make it possible to accomplish the data reduction tests to all of the chips simultaneously, for example, the chips CHIP1 and CHIP2, simultaneously.

The data reduction test of the related art for the multi-chip package is the sequential test to be carried out one chip by one chip sequentially, wherein a selected single data input/output terminal is used to reduce data and input and output the data to the chip. No simultaneous data reduction test can be available for the related art because only one data input/output terminal can be selected for data input/output to carry out the data reduction test. The related art needs to allocate the selected single package terminal with different signals for respective chips. This allocation may cause the conflict of different signals or different sets of data for respective chips.

The first embodiment described above permits allocating chips with respective different data input/output terminals, thereby carrying out data reduction test for the chips simultaneously, without causing the conflict of different signals.

Figure 5:
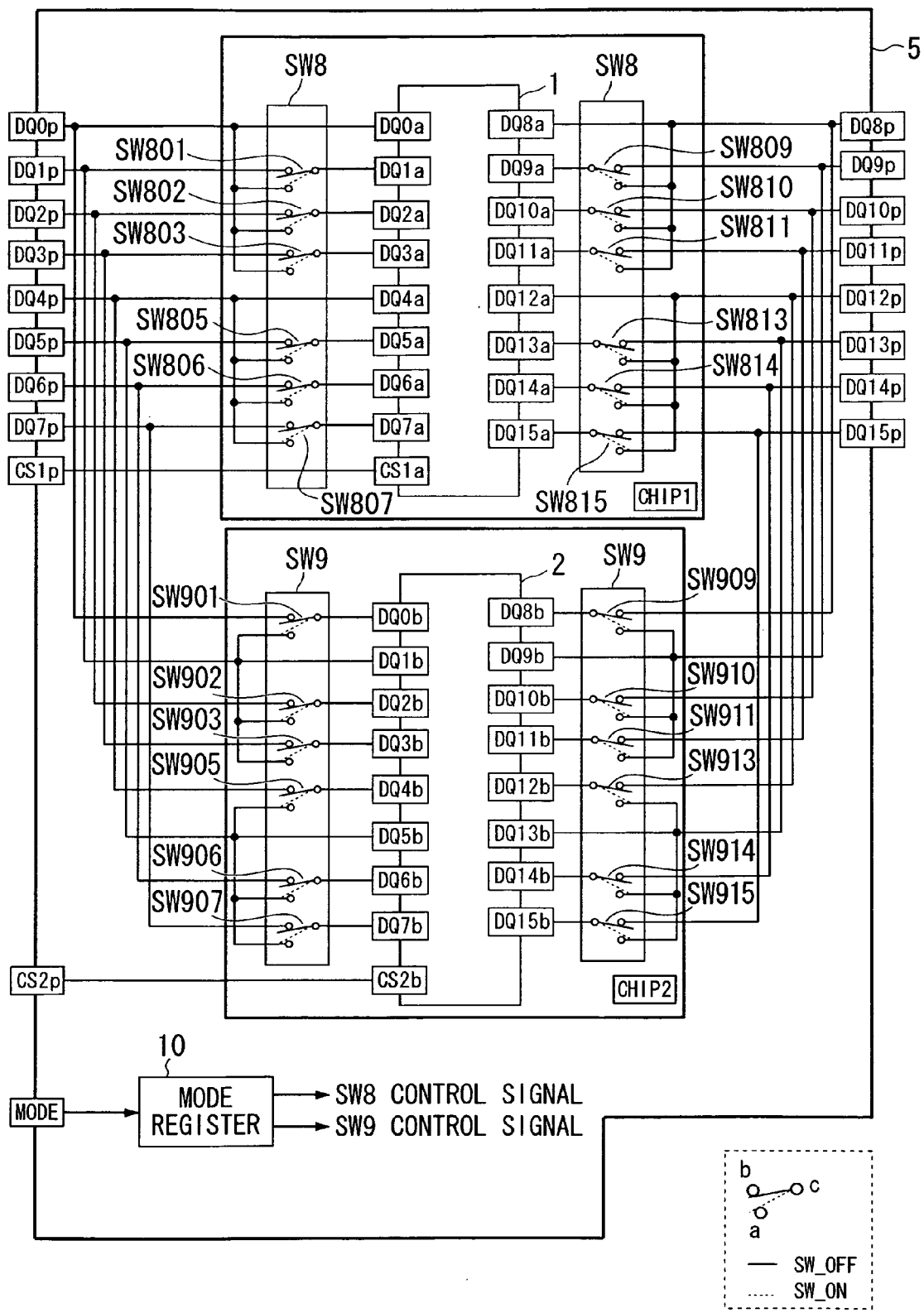
FIG. 5 illustrates the configuration of a multi-chip package in accordance with the second preferred embodiment.

FIG. 5 illustrates the configuration of a multi-chip package in accordance with the second preferred embodiment. The configuration of the multi-chip package as shown in FIG. 5 in accordance with the second preferred embodiment is different from the configuration of the multi-chip package of the related art as shown in FIG. 4. The configuration of the multi-chip package includes a plurality of chips, each of which may include a single-stage data line control switch, a set of package terminals, and a memory cell array, wherein the single-stage data line control switch is disposed between the set of package terminals, and the memory cell array. The configuration of the single-stage data line control switch as shown in FIG. 5 in accordance with the second preferred embodiment is different from the configuration of the data line control switch of the related art as shown in FIG. 4. The following descriptions will focus on the difference between the configuration of the single-stage data line control switch as shown in FIG. 5 and the related art as shown in FIG. 4.

In accordance with the related art as described with reference to FIG. 4, the first and second chips CHIP1 and CHIP2 have first and second sets of data line control switches SW3 and SW4, each set being disposed between the set of package terminals 5 and the memory cell array 1 or 2. The first and second sets of data line control switches SW3 and SW4 have the same configuration as each other.

In accordance with the second embodiment to be described with reference to FIG. 5, the first and second chips CHIP1 and CHIP2 have first and second sets of data line control switches SW8 and SW9, each set being disposed between the set of package terminals 5 and the memory cell array 1 or 2. The first and second sets of data line control switches SW3 and SW4 have different configurations from each other.

The difference of the second embodiment to be described with reference to FIG. 5 from the related art as described with reference to FIG. 4 is whether different chips have different configurations of the data line control switches. As shown in FIG. 5, the first chip CHIP1 may include, but is not limited to, a first single set of data line control switches SW8 between the set of package terminals 5 and the memory cell array 1. As shown in FIG. 5, the second chip CHIP2 may include, but is not limited to, a second single set of data line control switches SW9 between the set of package terminals 5 and the memory cell array 2. The second single set of data line control switches SW9 is different in configuration from the first single set of data line control switches SW8. The first single set of data line control switches SW8 of the second embodiment to be described with reference to FIG. 5 has the same configuration as the first and second sets of data line control switches SW3 and SW4 of the related art as described with reference to FIG. 4. The second single set of data line control switches SW9 of the second embodiment to be described with reference to FIG. 5 has a different configuration from the first and second sets of data line control switches SW3 and SW4 of the related art as described with reference to FIG. 4. The second single set of data line control switches SW9 of the second embodiment to be described with reference to FIG. 5 has the same configuration as the sets of the data line control switches SW6 and SW7 of the first embodiment to be described with reference to FIG. 2.

The first set of data line control switches SW8 includes a first group of data line control switches SW801, SW802 and SW803, and a second group of data line control switches SW805, SW806 and SW807. The data line control switches SW801, SW802 and SW803 each have the make contact and the break contact, one contact of which is commonly connected to the data input/output package terminal DQ0p. For example, as shown in FIG. 5, the data line control switch SW801 has the make contact "a" which is connected to the data input/output package terminal DQ0p. The data line control switch SW801 has the break contact "b" which is connected to the data input/output package terminal DQ1p. The data line control switch SW802 has the make contact "a" which is connected to the data input/output package terminal DQ0p. The data line control switch SW802 has the break contact "b" which is connected to the data input/output package terminal DQ2p. The data line control switch SW803 has the make contact "a" which is connected to the data input/output package terminal DQ0p. The data line control switch SW803 has the break contact "b" which is connected to the data input/output package terminal DQ3p. The data line control switches SW805, SW806 and SW807 each have the make contact and the break contact, one contact of which is commonly connected to the data input/output package terminal DQ4p. For example, as shown in FIG. 5, the data line control switch SW805 has the make contact "a" which is connected to the data input/output package terminal DQ4p. The data line control switch SW805 has the break contact "b" which is connected to the data input/output package terminal DQ5p. The data line control switch SW806 has the make contact "a"

which is connected to the data input/output package terminal DQ4p. The data line control switch SW806 has the break contact "b" which is connected to the data input/output package terminal DQ6p. The data line control switch SW807 has the make contact "a" which is connected to the data input/output package terminal DQ4p. The data line control switch SW807 has the break contact "b" which is connected to the data input/output package terminal DQ7p.

The first set of data line control switch SW8 further includes a third group of data line control switches SW809, SW810 and SW811, and a fourth group of data line control switches SW813, SW814 and SW815. The data line control switches SW809, SW810 and SW811 each have the make contact and the break contact, one contact of which is commonly connected to the data input/output package terminal DQ8p. For example, as shown in FIG. 5, the data line control switch SW809 has the make contact "a" which is connected to the data input/output package terminal DQ8p. The data line control switch SW809 has the break contact "b" which is connected to the data input/output package terminal DQ9p. The data line control switch SW810 has the make contact "a" which is connected to the data input/output package terminal DQ8p. The data line control switch SW810 has the break contact "b" which is connected to the data input/output package terminal DQ10p. The data line control switch SW811 has the make contact "a" which is connected to the data input/output package terminal DQ8p. The data line control switch SW811 has the break contact "b" which is connected to the data input/output package terminal DQ11p. The data line control switches SW813, SW814 and SW815 each have the make contact and the break contact, one contact of which is commonly connected to the data input/output package terminal DQ12p. For example, as shown in FIG. 5, the data line control switch SW813 has the make contact "a" which is connected to the data input/output package terminal DQ12p. The data line control switch SW813 has the break contact "b" which is connected to the data input/output package terminal DQ13p. The data line control switch SW814 has the make contact "a" which is connected to the data input/output package terminal DQ12p. The data line control switch SW814 has the break contact "b" which is connected to the data input/output package terminal DQ14p. The data line control switch SW815 has the make contact "a" which is connected to the data input/output package terminal DQ12p. The data line control switch SW815 has the break contact "b" which is connected to the data input/output package terminal DQ15p.

The above-described data line control switches SW801, SW802, SW803, SW805, SW806, SW807, SW809, SW810, SW811, SW813, SW814 and SW815 belong to the first set of data line control switch SW8. Those data line control switches included in the first set of data line control switch SW8 perform ON and OFF switching operations, wherein the switching operations are controlled as a whole based on a SW8 control signal. The SW8 control signal is to control the ON and OFF state of the first set of data line control switch SW8 as a whole. The SW8 control signal is supplied from a mode register 10. The mode register 10 receives a mode selecting signal MODE and generates the SW8 control signal based on the mode selecting signal MODE.

It is apparent that the present invention is not limited to the above embodiments, but may be modified and changed without departing from the scope and spirit of the invention.

What is claimed is:

1. A semiconductor device comprising:
a plurality of package terminals included in a package;
a plurality of chips provided on the package, each of the chips including a memory cell array and a plurality of data input/output terminals; and
a plurality of data line control switches disposed between the plurality of package terminals and the plurality of data input/output terminals, the plurality of data line control switches of each of the chips connecting the data input/output terminals of each of the chips to corresponding ones of the plurality of package terminals in a normal mode,
the plurality of data line control switches connecting different groups of the data input/output terminals in different ones of the chips to respective groups of the package terminals in a test mode, the respective groups of the data input/output terminals belonging to the plurality of data input/output terminals,
wherein the respective groups of the package terminals is different between different ones of the chips.

2. The semiconductor device according to claim 1, wherein the plurality of data line control switches connects first and second groups of the data input/output terminals of a first one of the plurality of chips commonly to first and second ones of the package terminals respectively, and
the plurality of data line control switches connects first and second groups of the data input/output terminals of a second one of the plurality of chips commonly to third and fourth ones of the package terminals respectively.

3. The semiconductor device according to claim 1, wherein the plurality of data line control switches of each of the plurality of chips comprises a plurality of stages of the data line control switches which are connected in series between the plurality of package terminals and the plurality of data input/output terminals, and the different stages of the data line control switches of each of the plurality of chips provide different connections between the plurality of package terminals and the plurality of data input/output terminals.

4. The semiconductor device according to claim 1, wherein the plurality of data line control switches of each of the plurality of chips comprises a single stage of the data line control switches which is connected between the plurality of package terminals and the plurality of data input/output terminals, and respective single stages of the data line control switches of the plurality of chips provide different connections between the plurality of package terminals and the plurality of data input/output terminals.

5. The semiconductor device according to claim 1, wherein the plurality of chips comprises m (m≧2) of the chips,
the plurality of data line control switches of each of the plurality of chips comprises m−1 of the data line control switches on data lines that connect between the plurality of package terminals and the plurality of data input/output terminals,
m of the data line control switches of each of the plurality of chips are provided on data lines that connect between non-use package terminals that are not used in the test mode and corresponding data input/output terminals,
m or more of the package terminals are allocated to each group of the data input/output terminals.

6. The semiconductor device according to claim 5, wherein the plurality of chips comprises two of the chips,
each of the chips has a memory cell array with a 16 bit width, and
each group of the data input/output terminals comprises four data input/output terminals.

7. The semiconductor device according to claim 5, wherein the plurality of chips comprises sixteen of the chips, each of the chips has a memory cell array with a 16 bit width, and
each group of the data input/output terminals comprises sixteen data input/output terminals.

8. The semiconductor device according to claim 5, wherein the plurality of chips comprises thirty two of the chips,
each of the chips has a memory cell array with a 32 bit width, and
each group of the data input/output terminals comprises thirty two data input/output terminals.

9. A semiconductor device comprising:
a first chip included in a package, the first chip having a first memory cell array and a first set of data input/output terminals;
a second chip included in the package, the second chip having a second memory cell array and a second set of data input/output terminals;
a plurality of package terminals provided on the package, the plurality of package terminals being common to the first and second chips;
a first group of data line control switches provided on the first chip, the first group of data line control switches being disposed between the plurality of package terminals and the first set of data input/output terminals, the first group of data line control switches connecting the data input/output terminals to corresponding ones of the plurality of package terminals in a normal mode, the second group of data line control switches connecting the data input/output terminals commonly to first respective ones of the package terminals in a test mode, the respective ones of the data input/output terminals belonging to the first set of data input/output terminals; and
a second group of data line control switches provided on the second chip, the second group of data line control switches being disposed between the plurality of package terminals and the second set of data input/output terminals, the second group of data line control switches connecting the data input/output terminals to corresponding ones of the plurality of package terminals in the normal mode, the second group of data line control switches connecting the data input/output terminals commonly to second respective ones of the package terminals in the test mode, the second respective ones of the data input/output terminals belonging to the second set of data input/output terminals,
wherein the first respective ones of the package terminals are different from the second respective ones of the package terminals.

10. The semiconductor device according to claim 9, wherein the first group of data line control switches comprises a first plurality of stages of the data line control switches which are connected in series between the plurality of package terminals and the first set of data input/output terminals, and
the second group of data line control switches comprises a second plurality of stages of the data line control switches which are connected in series between the plurality of package terminals and the second set of data input/output terminals, and
the first plurality of stages of the data line control switches and the second plurality of stages of the data line control switches provide different connections between the plurality of package terminals and the data input/output terminals.

11. The semiconductor device according to claim 9, wherein the first group of data line control switches comprises a first single stage of the data line control switches which is connected between the plurality of package terminals and the first set of data input/output terminals, and
the second group of data line control switches comprises a second single stage of the data line control switches which is connected between the plurality of package terminals and the second set of data input/output terminals,
the first and second single stages of the data line control switches provide different connections between the plurality of package terminals and the data input/output terminals.

12. The semiconductor device according to claim 9, wherein each of the first and second chips comprises m ($m \geq 2$) of the chips,
each of the first and second groups of data line control switches comprises m−1 of the data line control switches on data lines that connect between the plurality of package terminals and the data input/output terminals,
m of the data line control switches of each of the first and second chips are provided on data lines that connect between non-use package terminals that are not used in the test mode and corresponding data input/output terminals,
m or more of the package terminals are allocated to each set of the data input/output terminals.

13. A semiconductor device comprising:
a package substrate;
first and second package terminals arranged on the package substrate;
first and second chips mounted on the package substrate, each of the first and second chips comprising a first terminal connected to the first package terminal and a second terminal connected to the second package terminal;
a first switch arranged between the first and second package terminals and the first and second terminals of the first chip, the first switch disconnecting the second terminal of the first chip from the second package terminal and connecting the second terminal of the first chip to the first package terminal when a first signal is activated;
a second switch arranged between the first and second package terminals and the first and second terminals of the second chip, the second switch disconnecting the first terminal of the second chip from the first package terminal and connecting the first terminal of the second chip to the second package terminal when a second signal is activated; and
a control circuit that controls the first and second signals.

14. The semiconductor device according to claim 13, wherein the first switch disconnects the second terminal of the first chip from the first package terminal and connects the second terminal of the first chip to the second package terminal when the first signal is deactivated, the second switch disconnects the first terminal of the second chip from the second package terminal and connects the first terminal of the second chip to the first terminal when the second signal is deactivated.

15. The semiconductor device according to claim 13, further comprising:
third and fourth package terminals arranged on each of the first and second chips,
wherein each of the first and second chips further comprises a third terminal connected to the third package terminal and a fourth terminal connected to the fourth package terminal, the first switch disconnects the third and fourth terminals of the first chip from the third and fourth package terminals, respectively, and connects each of the third and fourth terminals of the first chip to the first package terminal when the first signal is activated, and the second switch disconnects the third and fourth terminals of the second chip from the third and fourth package terminals, respectively, and connects each of the third and fourth terminals of the second chip to the second package terminal when the second signal is activated.

16. The semiconductor device according to claim 15, wherein the first switch disconnects each of the third and fourth terminals of the first chip from the first package terminal and connects the third and fourth terminals of the first chip to the third and fourth package terminals, respectively when the first signal is deactivated, and the second switch disconnects each of the third and fourth terminals of the second chip from the second package terminal and connects the third and fourth terminals of the second chip to the third and fourth package terminals, respectively when the second signal is deactivated.

17. The semiconductor device according to claim 16, wherein the first, second third and fourth terminals of the first and second chips supply data to the first, second, third and fourth package terminals, respectively when the first and second signals are deactivated, and each of the first, second, third and fourth terminals of the first chip supplies data to the first package terminal and each of the first, second, third and fourth terminals of the second chip supplies data to the second package terminal when the first and second signals are activated.

* * * * *